(12) United States Patent
Endo et al.

(10) Patent No.: US 6,487,130 B2
(45) Date of Patent: Nov. 26, 2002

(54) SEMICONDUCTOR INTEGRATED CIRCUIT DEVICE

(75) Inventors: Toru Endo, Kawasaki (JP); Shoichiro Kawashima, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/885,928

(22) Filed: Jun. 22, 2001

(65) Prior Publication Data

US 2002/0060930 A1 May 23, 2002

(30) Foreign Application Priority Data

Nov. 21, 2000 (JP) .................................. 2000-354897

(51) Int. Cl.$^7$ ............................................. G11C 11/22
(52) U.S. Cl. .................................. 365/189.09; 365/145
(58) Field of Search ........................... 365/145, 189.09, 365/210

(56) References Cited

U.S. PATENT DOCUMENTS 6,297,985 B1 * 10/2001 Kang .......................... 365/145

* cited by examiner

*Primary Examiner*—Vu A. Le
(74) *Attorney, Agent, or Firm*—Arent Fox Kintner Plotkin & Kahn, PLLC

(57) ABSTRACT

A semiconductor device includes memory cells of one-transistor one-capacitor connected to n+1 bit lines that are simultaneously driven, sense amplifiers connected to the n+1 bit lines, and a reference voltage generating circuit generates an average voltage of a highest voltage and a lowest voltage among bit line voltages that are obtained by accessing the n+1 bit lines in parallel, and supplying the average voltage to the sense amplifiers as a reference voltage.

7 Claims, 16 Drawing Sheets

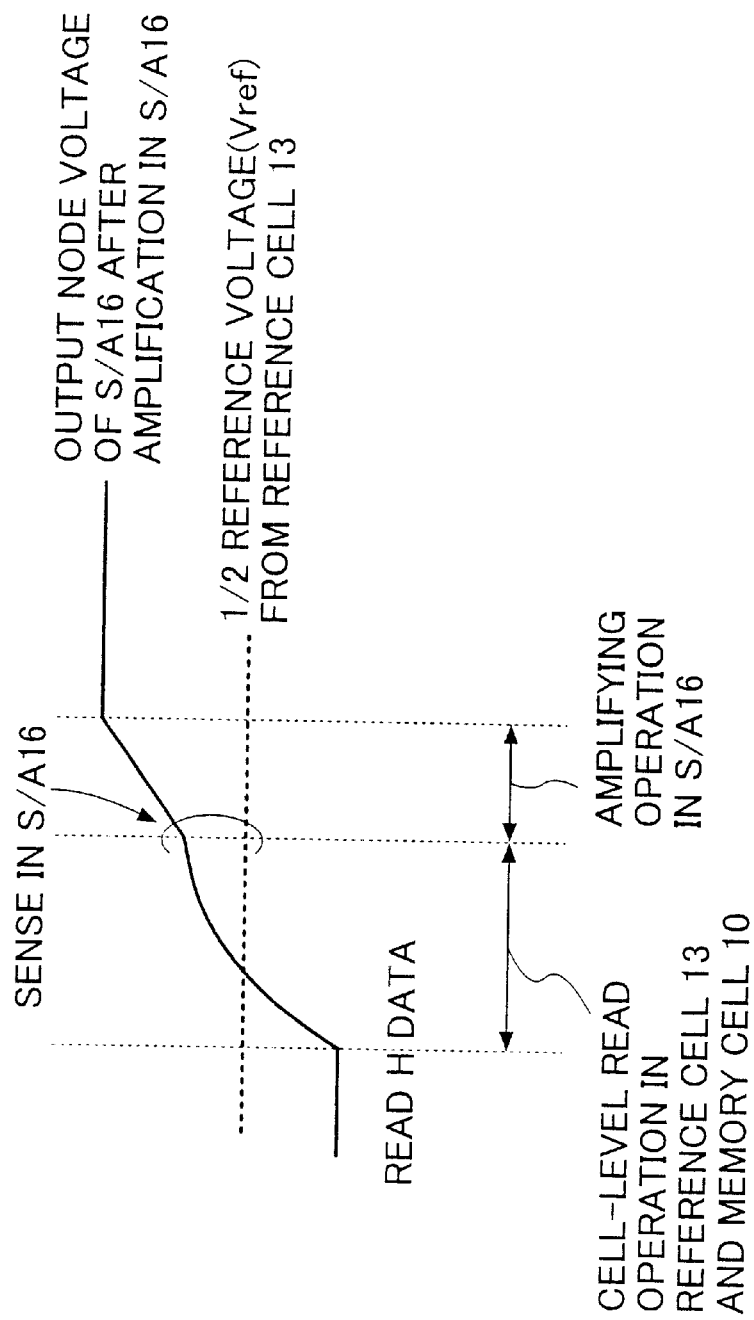

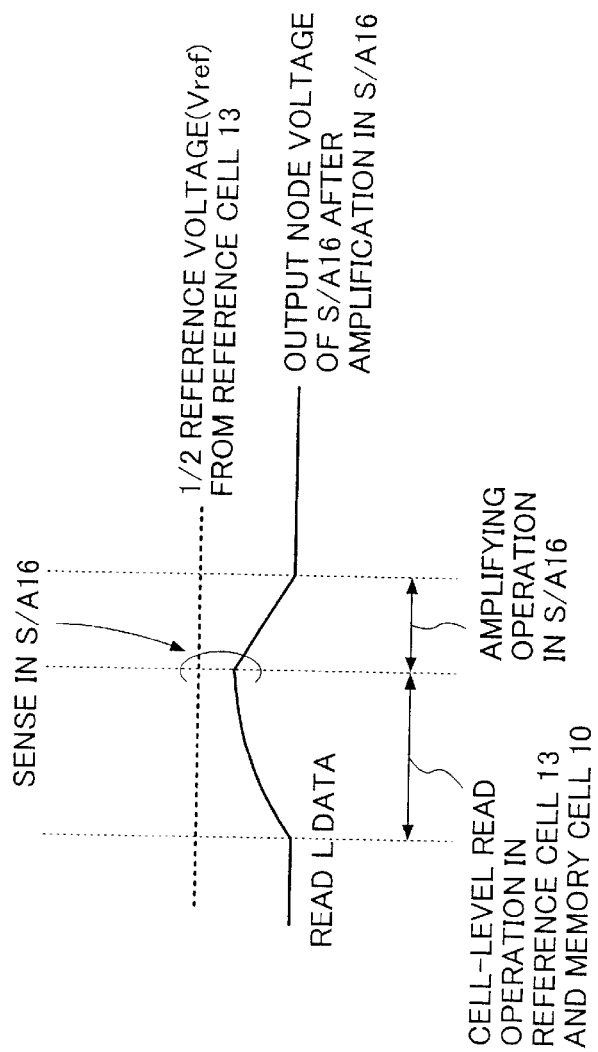

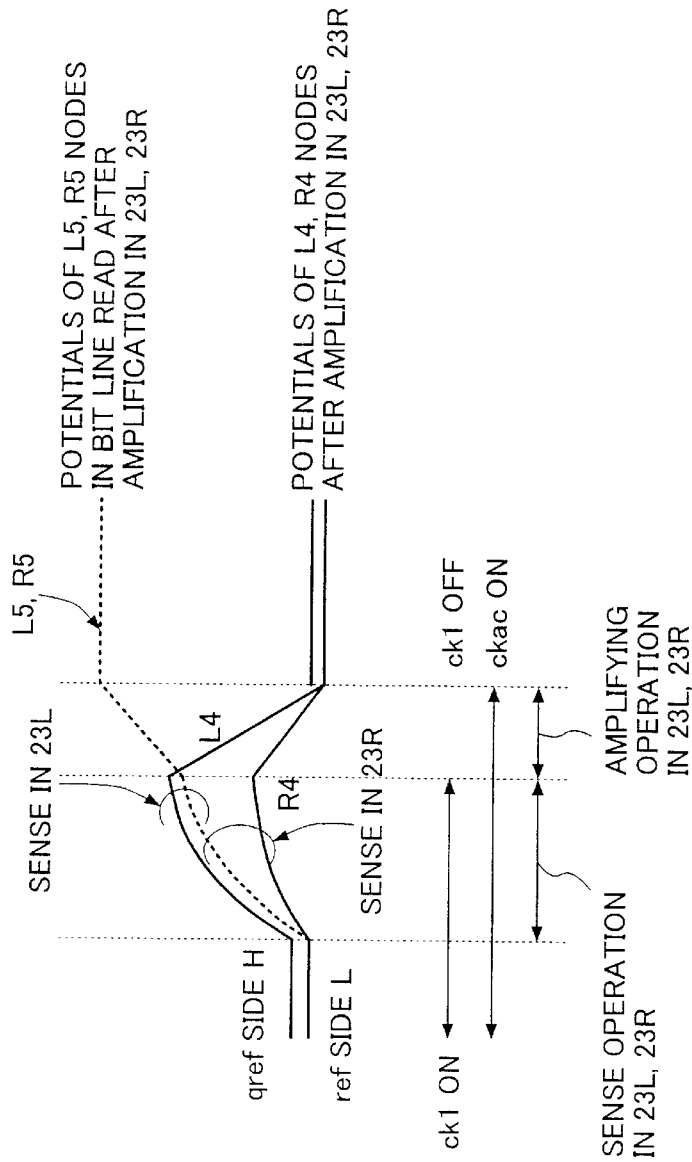

US 6,487,130 B2

SEMICONDUCTOR INTEGRATED CIRCUIT DEVICE

BACKGROUND OF THE INVENTION

1. Field of the Invention

The present invention generally relates to semiconductor integrated circuit devices, and more particularly to a semiconductor integrated circuit device having a ferroelectric random access memory (FeRAM) in which a ferroelectric is used to form a cell capacitor. More particularly, the present invention is concerned with a technique for generating a reference voltage that is to be supplied to a sense amplifier associated with a ferroelectric memory of a one-transistor one-capacitor type (1T1C).

2. Description of the Related Art

FIG. 1 is a circuit diagram of a conventional ferroelectric memory. Sense amplifiers (S/A) 16 are coupled to n bit lines $BL_1$ through $BL_n$ (n is an integer) via memory cells 10 of the 1T1C type and transfer transistors 18. Each of the memory cells 10 includes a transistor 11 and a cell capacitor 12. A reference cell 13, which is made up of a transistor 14 and a capacitor 15, is connected to a reference bit line $BL_{ref}$. A reference voltage generating circuit 17 is coupled to the reference bit line $BL_{ref}$ via a transfer transistor 19. Each of the bit lines BL1 through $BL_n$ is connected to a respective single sense amplifier 16 (single sense amplifier type).

When the memory cells of the 1T1C type are used, a reference voltage Vref is defined between a bit line voltage that appears when data "1" is read and another bit line voltage that appears when data "0" is read. It is also possible to define the reference voltage so as to fall within a range defined by amplified bit line voltages. The reference voltage Vref is compared with the read bit line voltage or the amplified version thereof in order to make a decision as to whether the read data is "1" or "0". The reference voltage Vref is generated by the reference cell 13 and the reference voltage generating circuit 17. The reference voltage Vref is between the bit line voltage that appears when data "1" is read and the bit line voltage that appears when data "0" is read. For example, the reference voltage Vref is the average voltage of the bit line voltages that appear for read data "1" and "0". In FIG. 1, a symbol CP denotes a cell plate line connected to capacitor plates of the capacitors 12 and 15.

FIGS. 2A and 2B are waveform diagrams that show data read operations of the circuit configuration shown in FIG. 1. More particularly, FIG. 2A shows an operation in which data "1" (high-level data: H data) is read, and FIG. 2B shows an operation in which data "0" (low-level data: L data) is read. FIGS. 2A and 2B show that the potential of read data is compared with the reference voltage Vref in order to determine whether the read data is H data or L data.

The capacitor 15 may be formed so as to use an oxide film capacitor or a ferroelectric substance. The cell capacitors 12 of the memory cells 10 have a characteristic such that the quantity of polarization decreases as the number of times of polarization inversion increases. Thus, when the oxide-film capacitor is used to generate the reference voltage Vref, decrease in the quantity of polarization of the cell capacitors cannot be traced. In contrast, the following problem will occur if the cell capacitors are used to generate the reference voltage Vref. When memory cells connected to an identical bit line are accessed, a single reference cell or a pair of reference cells are used (the single reference 13 is used in the configuration shown in FIG. 1). Thus, the number of times the reference cell 13 is accessed is larger than the number of times the memory cells 10 are accessed. This means that the quantity of polarization of the reference cell 13 is decreased much more greatly than the quantity of polarization of the memory cells 10. This would make it difficult to generate the reference voltage Vref for the quantity of polarization of the reference cell 13 that has been reduced as much as the quantity of polarization of the memory cells 10. Therefore, the number of rewrite times practically available for the 1T1C type is smaller than that available for a 2T2C type (two-transistor two-capacitor type).

In the circuit configuration equipped with the 2T2C type memory cells, two complementary items of information are written into and read from two memory cells with respect to a single piece of data. Hence, the capacitors of the two memory cells are ensured so that they have the same number of times of access. Thus, the two memory cells exhibit the same characteristics with regard to decrease in the quantity of polarization. Further, the complementary voltages that correspond to the two complementary items of information are compared with each other. Therefore, there is no need for the reference voltage Vref. In addition, the comparing operation of the 2T2C type configuration has a margin that is almost twice the margin obtained in the 1T1C type configuration. The operational margin of the 2T2C type configuration is the difference in potential between H data and L data. Such a large margin would ensure a number of rewrite times that could be satisfactorily applied to practical use. On the other hand, the 2T2C type memory cell needs a chip area that is twice the memory area of the 1T1C type memory cell. This prevents improvements in the integration density.

SUMMARY OF THE INVENTION

It is a general object of the present invention to provide a semiconductor integrated circuit device capable of ensuring a larger number of rewrite times without increasing the chip area.

The above object of the present invention is achieved by a semiconductor device comprising: memory cells of one-transistor one-capacitor connected to n+1 bit lines that are simultaneously driven; sense amplifiers connected to the n+1 bit lines; and a reference voltage generating circuit generates an average voltage of a highest voltage and a lowest voltage among bit line voltages that are obtained by accessing the n+1 bit lines in parallel, and supplying the average voltage to the sense amplifiers as a reference voltage.

The reference voltage is generated from the voltages of the n+1 bit lines, which are simultaneously driven (accessed in parallel). Hence, each of the memory cells such as ferroelectric memories has an identical characteristic change (decrease in the quantity of polarization for ferroelectric memories) based on the number of times data is written. The reference voltage is generated from data read from the memory cells described above. Therefore, the reference voltage reflects degradation of the memory cells, so that a practically sufficient number of rewrite times can be ensured.

BRIEF DESCRIPTION OF THE DRAWINGS

Other objects, features and advantages of the present invention will become more apparent from the following detailed description when read in conjunction with the accompanying drawings, in which:

FIGS. 2A and 2B are waveform diagrams of operation of the conventional device shown in FIG. 1;

FIGS. 13A and 13B are respectively waveform diagrams of an operation of the semiconductor device according to the third embodiment of the present invention shown in FIGS. 11 and 12.

DESCRIPTION OF THE PREFERRED EMBODIMENTS

Figure 1:
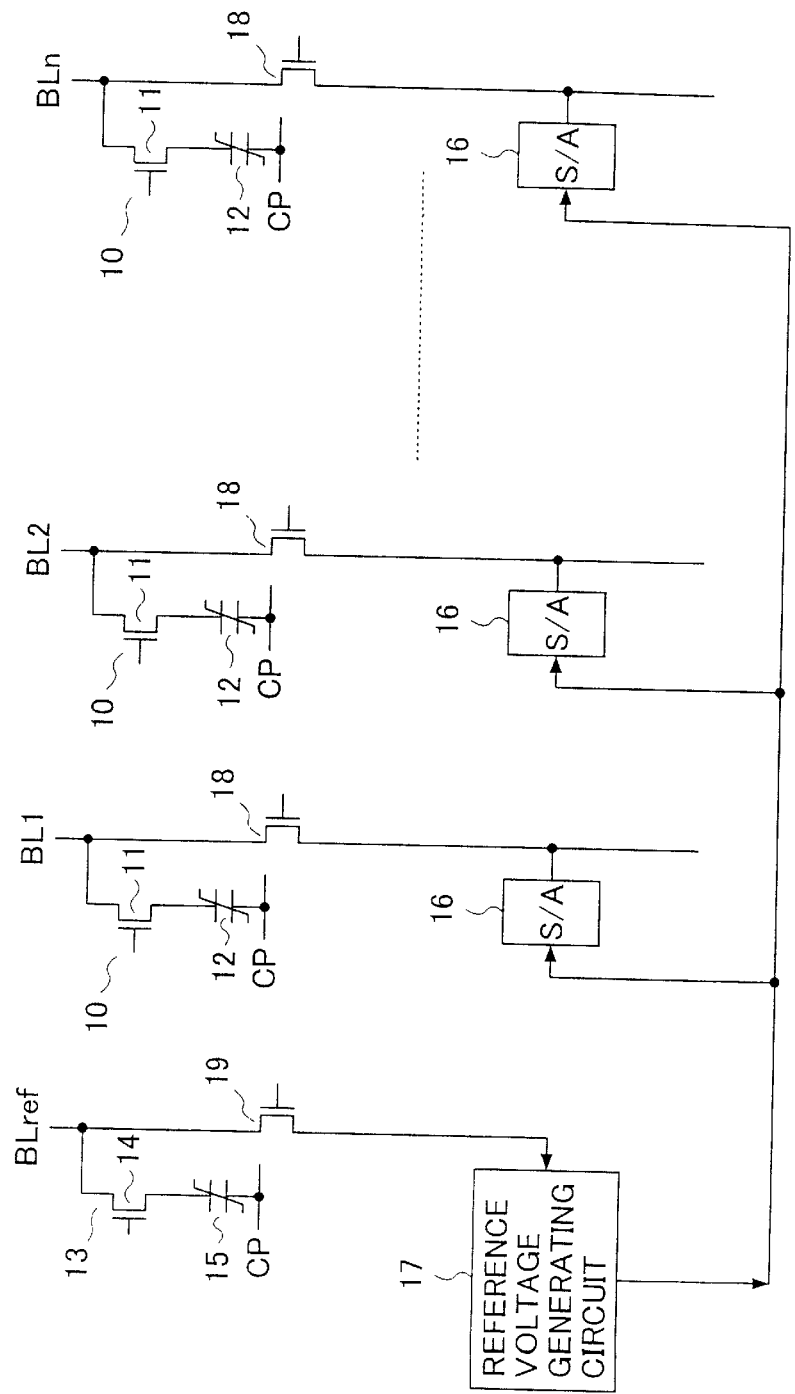
FIG. 1 is a circuit diagram of a conventional semiconductor integrated circuit device that is called a ferroelectric memory.
Figure 3:
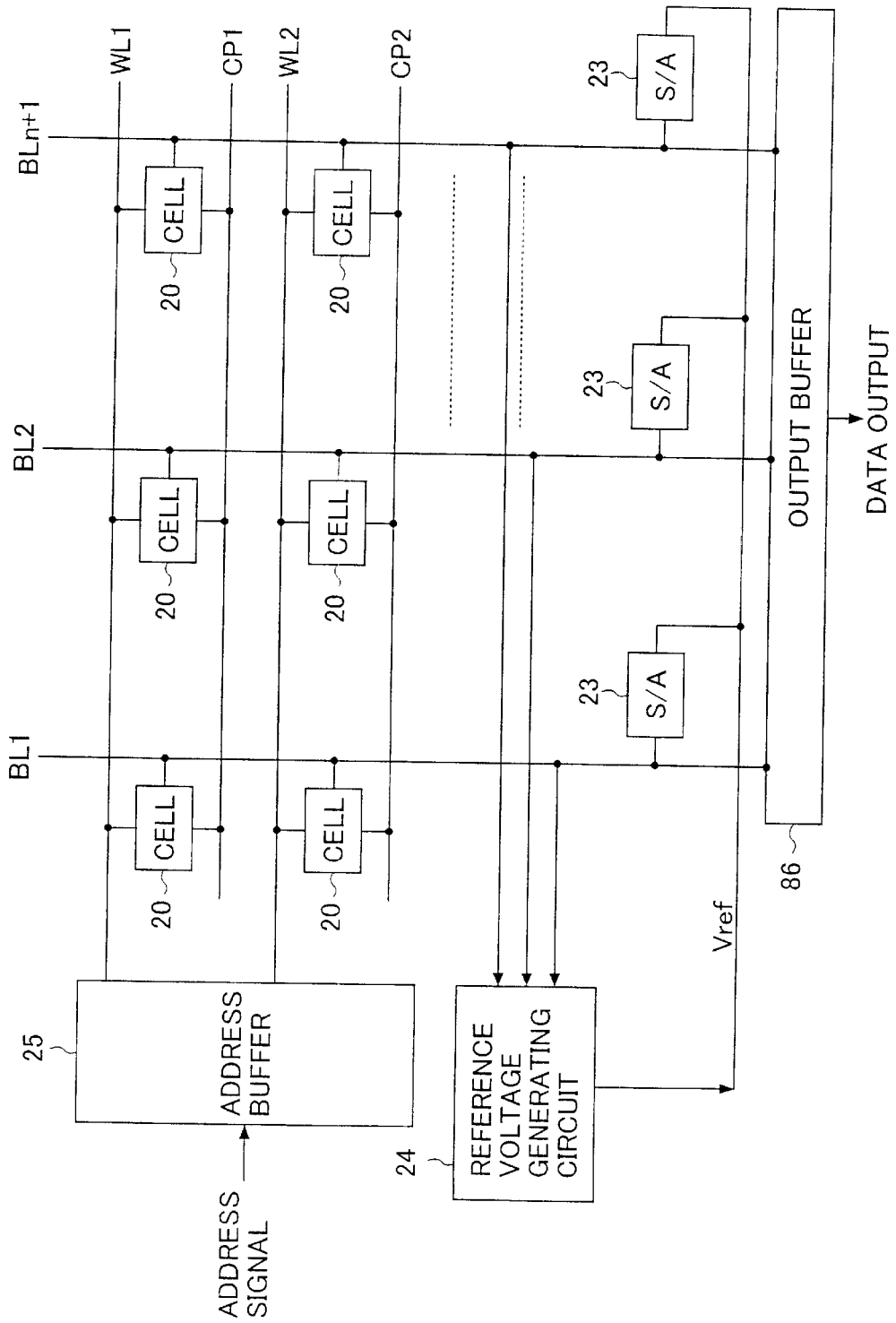
FIG. 3 is a block diagram of a semiconductor device according to a first embodiment of the present invention.

FIG. 3 is a block diagram of a semiconductor integrated circuit device according to a first embodiment of the present invention. The circuit configuration shown in FIG. 3 employs a reference voltage generating circuit 24, which is not used in the conventional configuration shown in FIG. 1. The circuit configuration shown in FIG. 3 is not equipped with the reference cell 13 shown in FIG. 1. The circuit configuration shown in FIG. 3 includes an (n+1)th bit line in addition to the n bit lines $BL_1$ through $BL_n$ used in FIG. 1. The (n+1)th bit line will be described in detail later.

Figure 4:
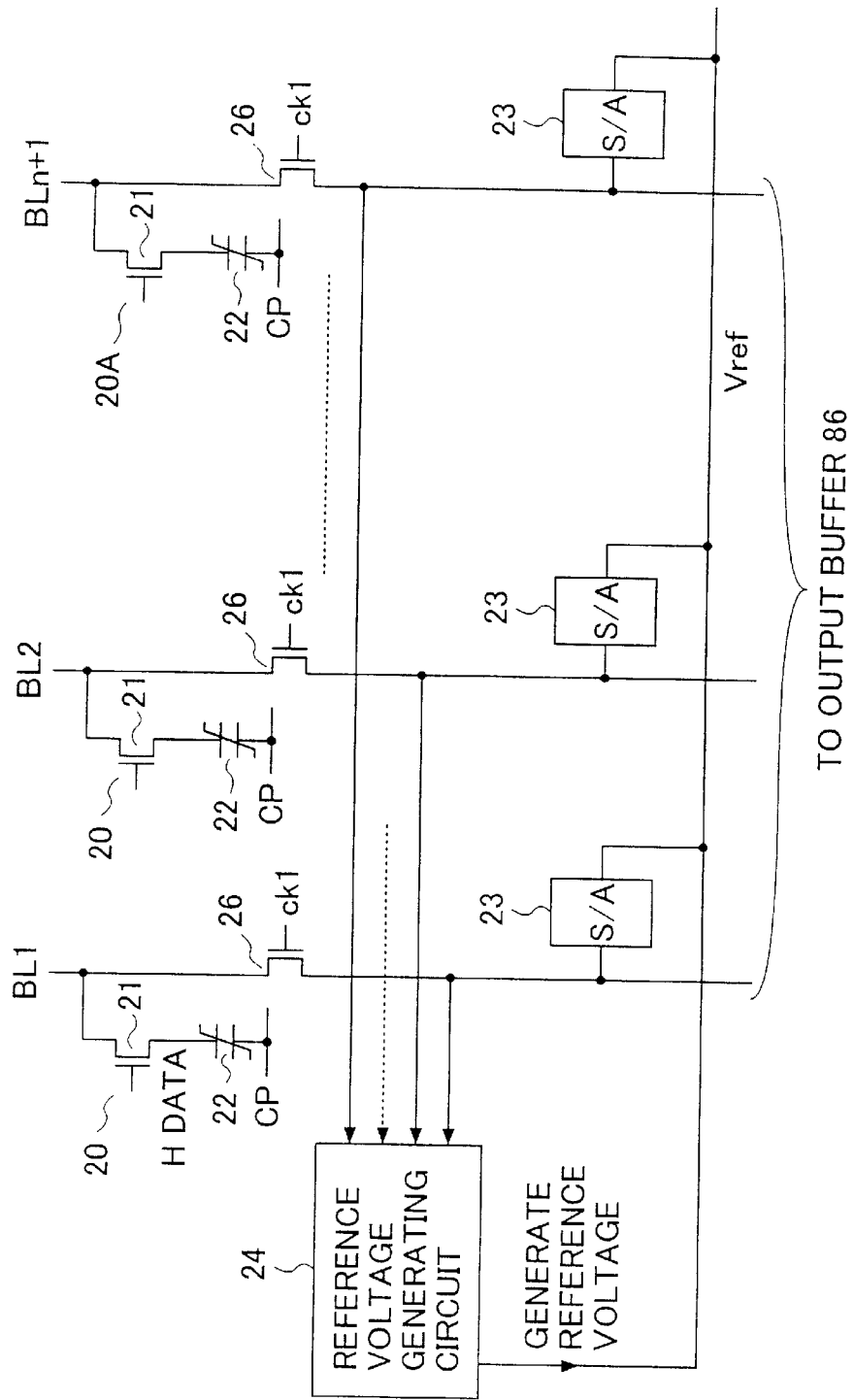
FIG. 4 is a circuit diagram of the semiconductor device shown in FIG. 3.

Memory cells 20 are arranged in rows and columns, and are corrected to corresponding bit lines $BL_1$ through $BL_{n+1}$, word lines $WL_1$, $WL_2$, . . . , and capacitor plates $CP_1$, $CP_2$, . . . As shown in FIG. 4, each of the memory cells 20 has a 1T1C type configuration, which a cell transistor 21 and a cell capacitor 22 formed of a ferroelectric substance. Sense amplifiers (S/A) 23 are connected to the bit lines $BL_1$ through $BL_{n+1}$ via transfer transistors 26. The transfer transistors 26 are supplied with a clock ckl. An address buffer 25 selects and drives one word line designated by an address signal applied to the address buffer 25. At the time of reading and writing data from and into a memory cell, a capacitor plate line driving circuit (not shown for the sake of simplicity because this circuit itself is known) selects and drives a corresponding capacitor plate line in accordance with the address signal applied thereto. It is to be noted that n memory cells connected to the identical word line are simultaneously selected (parallel access system). Therefore, the n memory cells always have an identical number of times of access and have an identical decrease in the quantity of polarization.

The reference voltage generating circuit 24 is connected to n+1 bit lines $BL_1$ through $BL_{n+1}$. The reference voltage generating circuit 24 detects the highest voltage and the lowest voltage, and generates a middle voltage located between the highest and lowest voltages. Preferably, the middle voltage is equal to half the sum of the highest and lowest voltages (average voltage). The middle voltage is then applied to the sense amplifiers 23 as a reference voltage $V_{ref}$. As has been described previously, the n+1 memory cells connected to the same word line have the same number of times of access and thus the same decrease in the quantity of polarization. Thus, the reference voltage $V_{ref}$ generated from the highest and lowest voltages available at two of the bit lines $BL_1$ through $BL_{n+1}$ reflects the quantity of polarization of the memory cells 20. As a result, it is possible to ensure the number of write times as many as that of the 2T2C type.

Figure 5A:
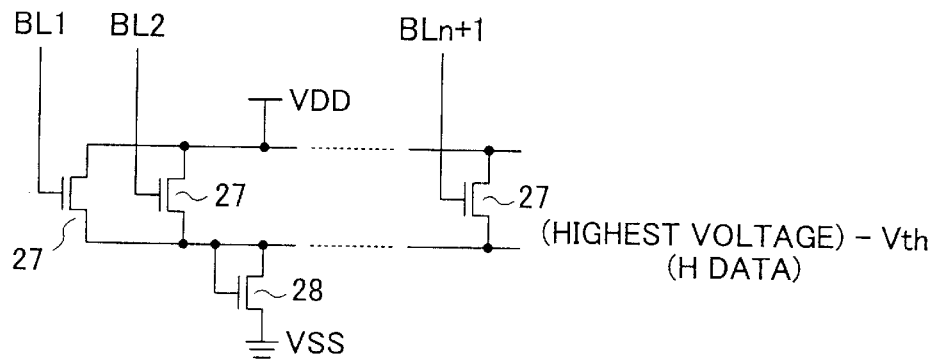
FIGS. 5A, 5B and 5C are respectively circuit diagrams of a reference voltage generating circuit shown in FIGS. 3 and 4.
Figure 5B:
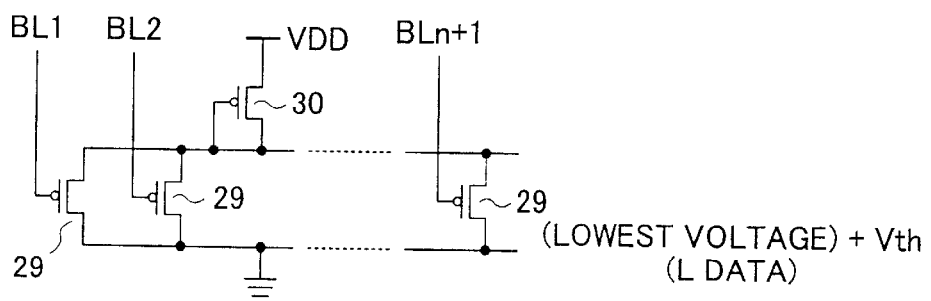
Figure 5C:
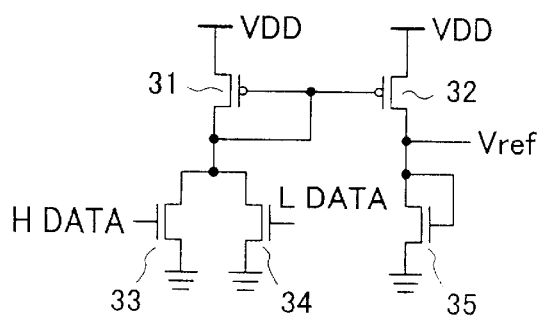

FIGS. 5A, 5B and 5C are circuit diagrams of a configuration of the reference voltage generating circuit 24. More particularly, FIG. 5A is a circuit that detects the highest voltage from among the voltages of the bit lines $BL_1$ through $BL_{n+1}$. FIG. 5B is a circuit that detects the lowest voltage from among the voltages of the bit lines $BL_1$ through $BL_{n+1}$. FIG. 5C is a circuit that generates the average voltage of the highest and lowest voltages.

Referring to FIG. 5A, an N-channel field effect transistor is provided to each of the bit lines $BL_1$ through $BL_{n+1}$. The N-channel field effect transistor may, for example, be a MOS (Metal Oxide Semiconductor) transistor. Hereinafter, the above-mentioned N-channel field effect transistor is referred to as an NMOS transistor for the sake of simplicity. The drains of the NMOS transistor are connected to a power supply voltage VDD, and the sources thereof are commonly connected to the gate and drain of an NMOS transistor 28. The source of the NMOS transistor 28 is grounded (in other words, connected to a power supply voltage VSS). Each of the bit lines $BL_1$ through $BL_{n+1}$ is connected to the gate of the corresponding one of the NMOS transistors 27. The sources of the NMOS transistor 27 (that is, the drain of the NMOS transistor 28) are at a potential obtained by subtracting the threshold voltage Vth of the NMOS transistors 27 from the highest voltage from among the voltages of the bit lines $BL_1$ through $BL_{n+1}$. Here, such a potential is H data.

Referring to FIG. 5B, a P-channel field effect transistor is provided to each of the bit lines $BL_1$ through $BL_{n+1}$. The P-channel field effect transistor may, for example, be a MOS transistor. Hereinafter, the above-mentioned P-channel field effect transistor is referred to as a PMOS transistor for the sake of simplicity. The sources of the PMOS transistors 29 are connected to the drain and gate of a PMOS transistor 30, and the drains thereof are grounded, namely, connected to the ground potential VSS. The source of the PMOS transistor 30 is connected to the power supply voltage VDD. Each of the bit lines $BL_1$ through $BL_{n+1}$ is connected to the gate of the corresponding one of the PMOS transistors 29 (in other words, the drain of the PMOS transistor 30). The sources of the PMOS transistors 29 are at a potential obtained by adding the threshold voltage Vth of the PMOS transistors 29 to the lowest voltage from among the voltages of the bit lines $BL_1$ through $BL_{n+1}$. Here, such a potential is L data.

Referring to FIG. 5C, the circuit that generates the average voltage (average voltage generating circuit) is made up of PMOS transistors 31 and 32, and NMOS transistors 33, 34 and 35. The PMOS transistors 31 and 32 form a current-mirror circuit. H data that is output by the circuit shown in FIG. 5A is applied to the gate of the NMOS transistor 33, and L data that is output by the circuit shown in FIG. 5B is applied to the gate of the NMOS transistor 34. The amount of current that flows in the PMOS transistor 31 of the current-mirror circuit depends on H data and L data. The average current that flows in the PMOS transistor 31 flows in the PMOS transistor 32 of the current-mirror circuit. With the above circuit configuration, the average voltage of the highest and lowest voltages, namely, the reference voltage $V_{ref}$ is output from a node at which the drain of the PMOS transistor 32 and the drain of the diode-connected NMOS transistor 35 are connected.

Figure 6:
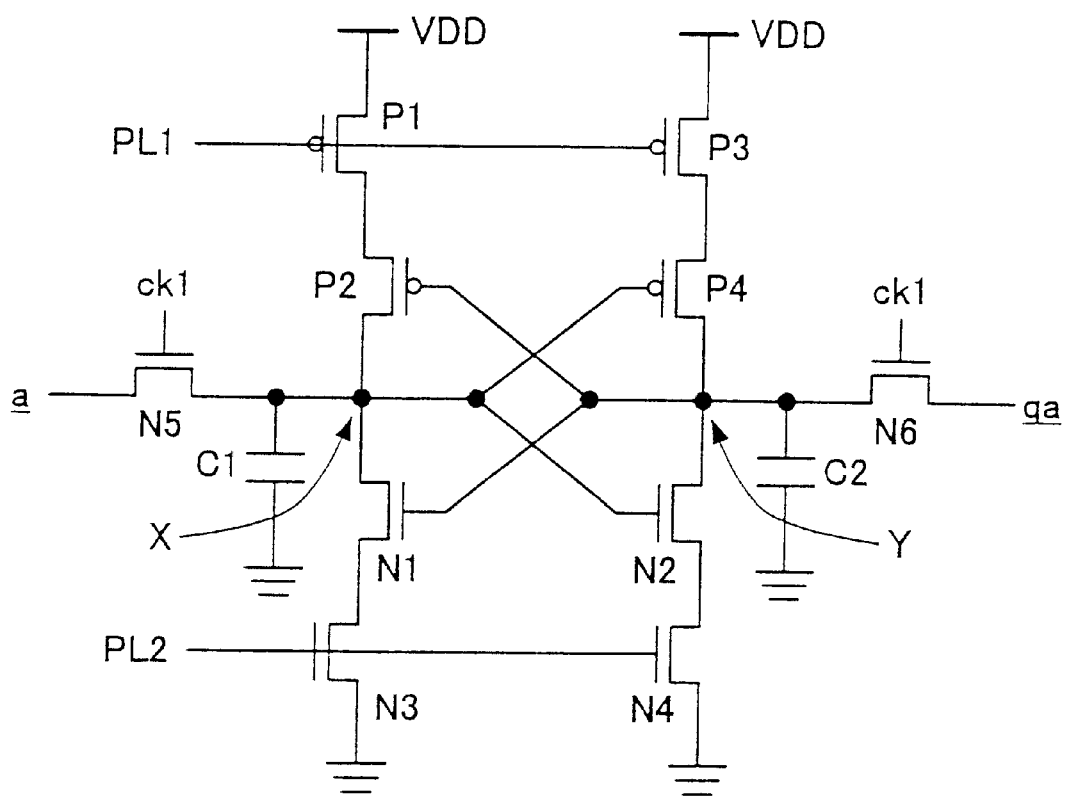
FIG. 6 is a circuit diagram of a sense amplifier shown in FIGS. 3 and 4.

FIG. 6 is a circuit diagram of the sense amplifiers 23 shown in FIGS. 3 and 4. Each sense amplifier 23 is made up of PMOS transistors P1 through P4, NMOS transistors N1 through N6, and sampling capacitors C1 and C2. In the initial state of the sense amplifier 23, the PMOS transistors P1 and P3 and the NMOS transistors N3 and N4 are OFF. When the sense amplifier 23 is driven, sense amplifier driving signals PL1 and PL2 are set to L and H levels, respectively. A signal (bit line voltage) applied to an input A and a signal (reference voltage $V_{ref}$) applied to an input qa are sampled in such a manner that the NMOS transistors N5 and N6 conduct in synchronism with the clock ck1, and are then stored in the sampling capacitors C1 and C2, respectively. The potential difference between the sampling capacitors C1 and C2 determines ON/OFF of the PMOS transistors P2 and P4, and thus determines the state of the sense amplifier 23. Subsequently, the PMOS transistors P1 and P3 and the NMOS transistors N3 and N4 are turned ON, so that the sensed state can be amplified toward the maximum amplitude defined by VDD and VSS.

The bit line $BL_{n+1}$ makes it possible to constantly provide a condition in which n+1 memory cells 20 connected to the same word line include at least one cell in which data "0" is stored and at least one cell in which data "1" is stored. The above condition enables the reference voltage generating circuit 24 to generate the reference voltage from the highest voltage and the lowest voltage. Therefore, even if data read to the bit lines $BL_1$ through $BL_n$ are all "0", data "1" is read to the bit line $BL_{n+1}$, so that the maximum voltage generating circuit 24 shown in FIG. 5A can always output H data equal to (the highest voltage)−Vth. Similarly, even if data read to the bit lines $BL_1$ through $BL_{n+1}$ are all "1", data "0" is read to the bit line $BL_{n+1}$, so that the maximum voltage generating circuit 24 shown in FIG. 5B can always output H data equal to (the lowest voltage)+Vth. As a result, the reference voltage generating circuit 24 can always generate the reference voltage Vref regardless of the values of the items of data that are read to the bit lines $BL_1$ through $BL_n$.

As will be described later, when data written to the bit lines $BL_1$ through $BL_n$ are all "0", data "1" is written into the memory cell 20 connected to the bit line $BL_{n+1}$. In contrast, when data written to the bit lines $BL_1$ through $BL_n$ are all "1", data "0" is written into the memory cell 20 connected to the bit line $BL_{n+1}$.

A description will now be given of a second embodiment of the present invention.

Figure 7:
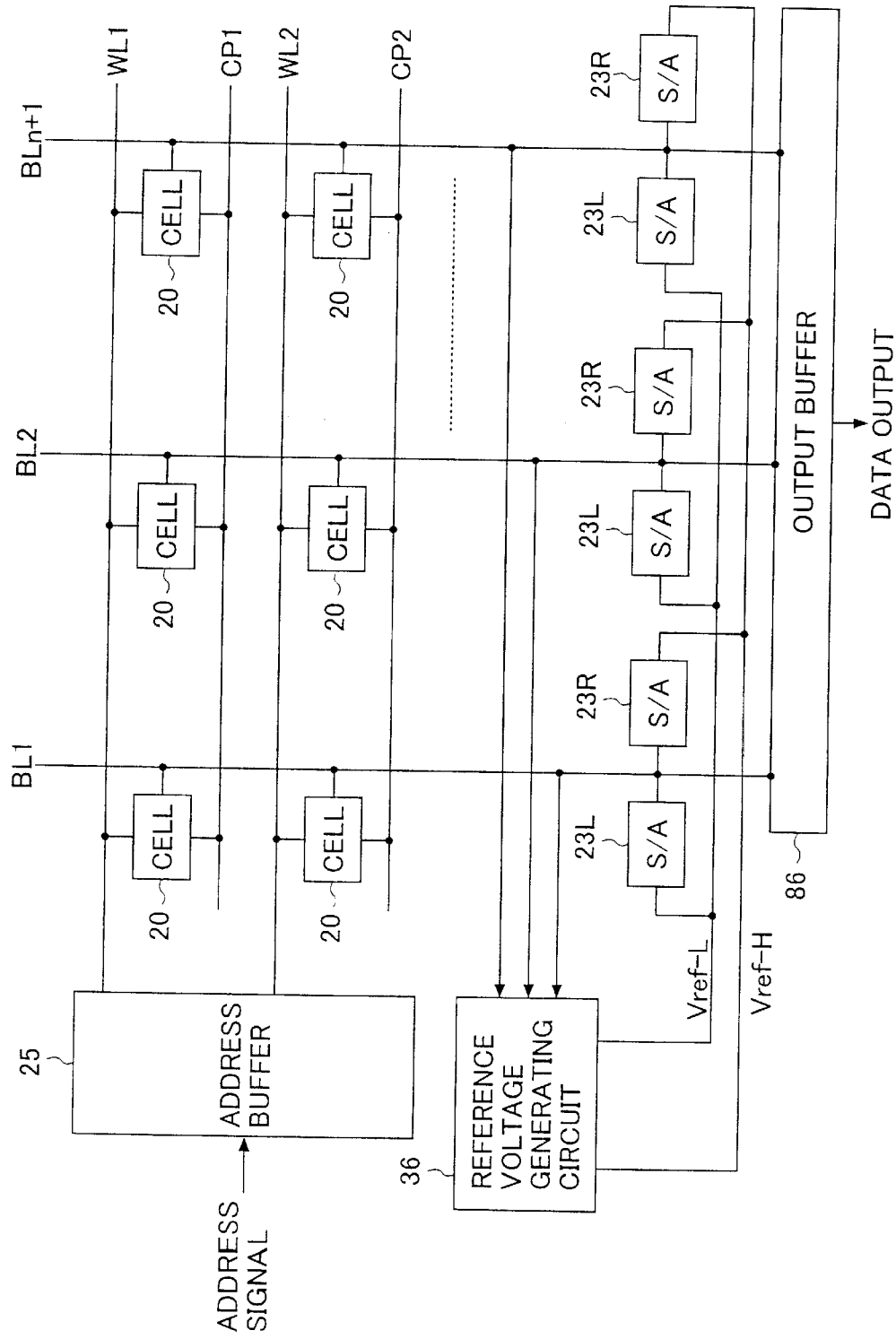
FIG. 7 is a block diagram of a semiconductor device according to a second embodiment of the present invention.
Figure 8:
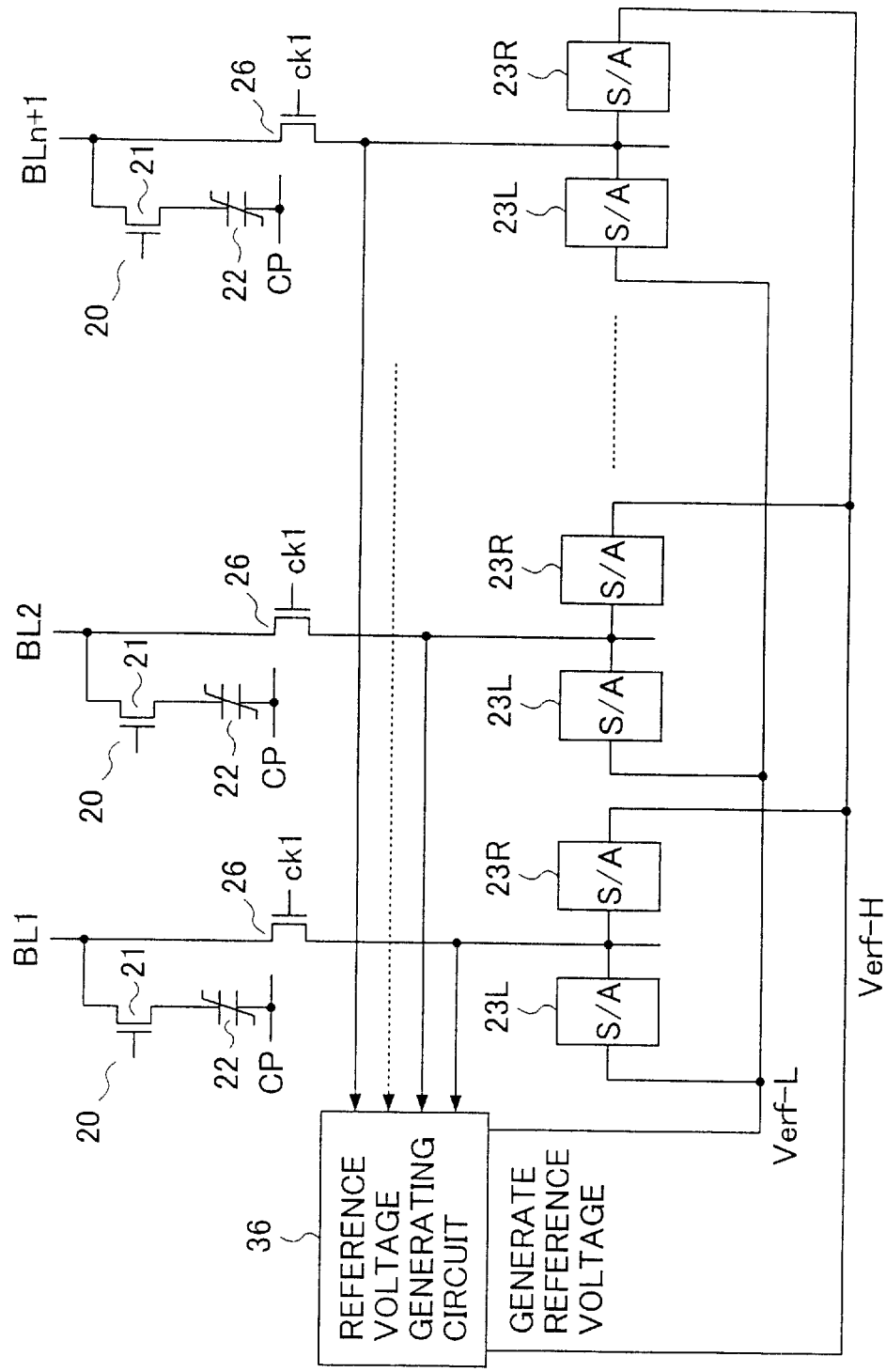
FIG. 8 is a circuit diagram of the semiconductor device shown in FIG. 7.

FIGS. 7 and 8 are respectively a block and a circuit diagram of a semiconductor device according to a second embodiment of the present invention. In these figures, parts that are the same as those shown in the previously described figures are given the same reference numerals. The second embodiment of the present invention has a configuration in which a pair of sense amplifiers 23L and 23R is provided for each of the bit lines $BL_1$ through $BL_{n+1}$ (a twin sense amplifier system), and a reference voltage generating circuit 36 supplies the pairs of sense amplifiers 23L and 23R with a L(low)-side reference voltage $Vref_L$ serving as a first reference voltage and a H(high)-side reference voltage $Vref_H$ serving as a second reference voltage. The reference voltage generating circuit 36 is configured so as to include the circuits shown in FIGS. 5A and 5B. The L-side reference voltage $Vref_L$ and the H-side reference voltage $Vref_H$ are respectively L data and H data shown in FIGS. 5B and 5A.

Each of the sense amplifiers 23L compares the L-side reference voltage $Vref_L$ with the read voltage on the corresponding bit line from the memory cell. Each of the sense amplifiers 23R compares the H-side reference voltage $Vref_H$ with the read voltage on the corresponding bit line from the memory cell. Each of the sense amplifiers 23L and 23R has the configuration shown in FIG. 6. One of the sense amplifiers 23L and 23R that has the greater difference between the read voltage and the reference voltage performs more strongly amplifies the read voltage than the other one, and finishes the operation ahead thereof. The difference between the input voltages applied to the other sense amplifier is approximately equal to zero. In this case, the output of the pair of sense amplifiers is at an intermediate potential between the H data and the L data. Then, based on the output levels of the two sense amplifiers 23R and 23L, it is determined whether the associated bit line voltage is at the H level or L level.

Figure 9:
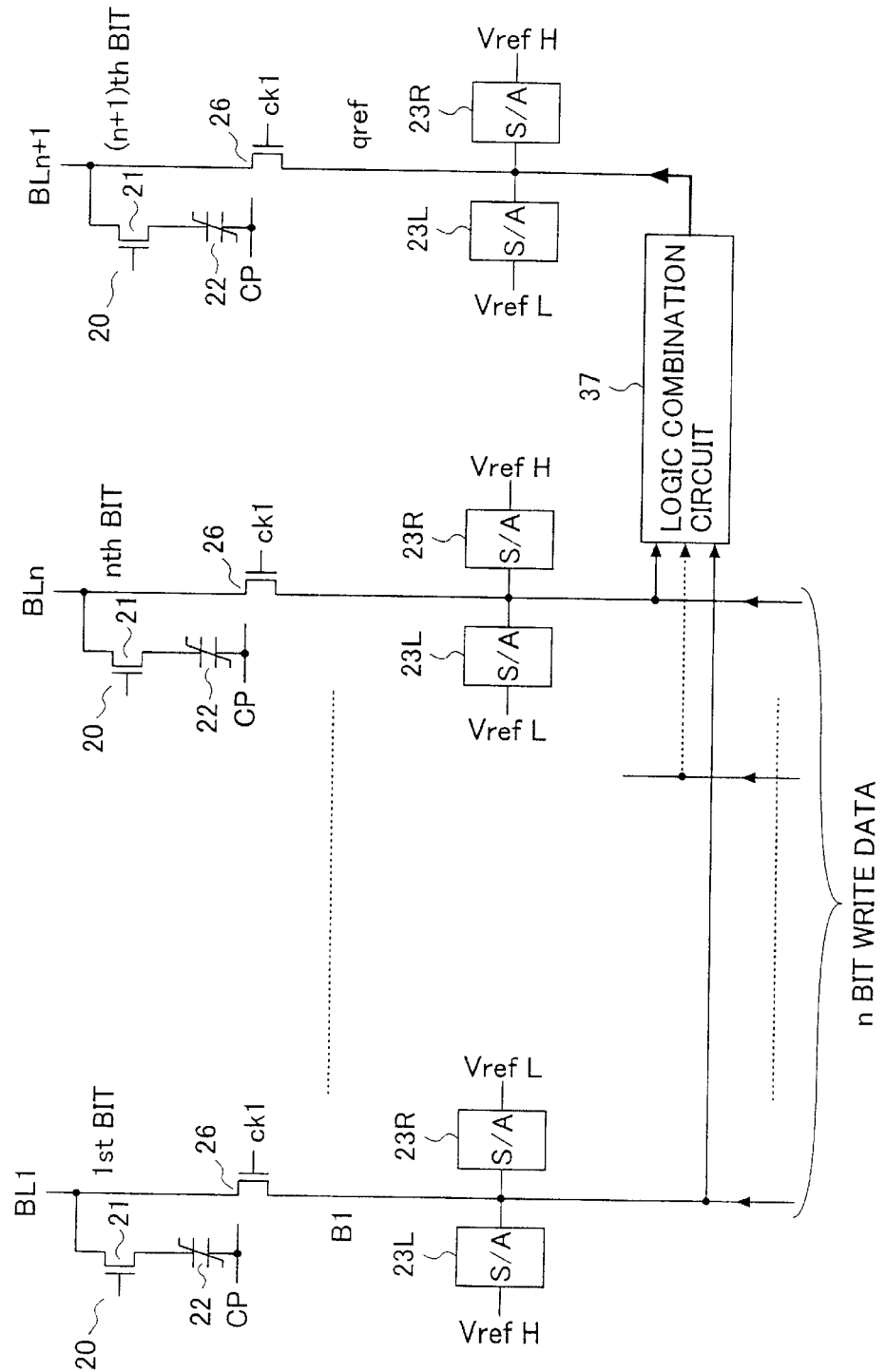
FIG. 9 is a circuit diagram a of a configuration of the semiconductor device according to the second embodiment of the present invention in which data "1" and data "0" are concurrently present in n+1 bits of data read to the n+1 bit lines.

FIG. 9 is a block diagram of the second embodiment of the present invention shown in FIGS. 7 and 8 in which redundant data (consisting of one bit) for the n-bit write data to be written into the memory cells connected to the bit lines $BL_1$ through $BL_n$ is written into the memory cell 20 connected to the bit line $BL_{n+1}$.

A logic combination circuit 37 writes redundant data for the n-bit write data to be written into the memory cells connected to the bit, lines $BL_1$ through $BL_n$ into the memory cell 20 write data are all "0", the logic combination circuit 37 writes its inverted data "1" into the memory cell 20 via the bit line $BL_{n+1}$ and the transfer transistor 26. In contrast, when the n-bit write data are all "1", the logic combination circuit 37 writes its inverted data "0" into the memory cell 20 via the bit line $BL_{n+1}$ and the transfer transistor 26. Thus, the (n+1)-bit data includes data "0" and "1" without exception, so that the L-side reference voltage $Vref_L$ and the H-side reference voltage $Vref_H$ can be generated regardless of the value of the n-bit data.

The logic combination circuit 37 can be applied to the first embodiment of the present invention shown in FIGS. 3 and 4.

Figure 10A:
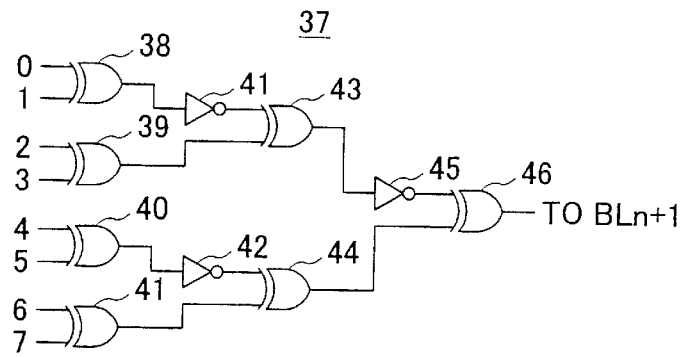
FIGS. 10A, 10B, 10C and 10D are respectively circuit diagrams of a logic combination circuit shown in FIG. 9.
Figure 10B:
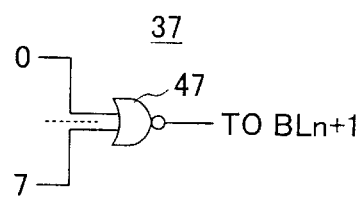
Figure 10C:
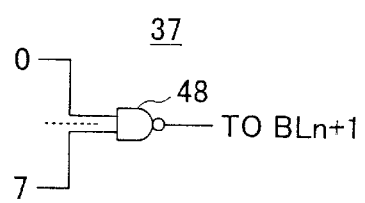
Figure 10D:
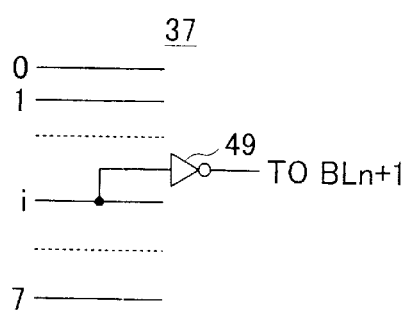

FIGS. 10A through 10D are circuit diagrams of four different configurations of the logic combination circuit 37. FIG. 10A illustrates an XOR (exclusive-OR) type of the logic combination circuit 37, which includes seven XOR gates 38–41, 43, 44 and 46, and inverters 41, 42 and 45. These components being connected as shown in FIG. 10A, in which "0" through "7" denote write data on the bit lines $BL_1$ through $BL_n$, respectively. FIG. 10B illustrates a NOR type of the logic combination circuit 37, which includes eight NOR gates connected as shown. FIG. 10C illustrates an AND type, which includes eight NAND gates 48. FIG. 10D illustrates an inverter type, which includes and inverter that inverts an arbitrary one of the bits.

The semiconductor device according to the second embodiment of the present invention can be summarized so that it comprises memory cells of a one-transistor one-capacitor type connected to n+1 bit lines $BL_1$ through $BL_{n+1}$ simultaneously driven, pairs of sense amplifiers 23L and 23R respectively connected to the n+1 bit lines, and the reference voltage generating circuit 36 that generates, first and second reference voltages $Vref_L$ and $Vref_H$, the highest and lowest voltages or voltages corresponding thereto among the bit line voltages obtained when the n+1 bit lines are accessed in parallel. One of each of the pairs of sense amplifiers compares the first reference voltage $Vref_L$ with the voltage of the corresponding one of the bit lines, and the other compares the second reference voltage Vref-H with the voltage thereof. Then, each of the pairs of sense amplifiers makes a decision on the logical level of the corresponding bit line.

Figure 11:
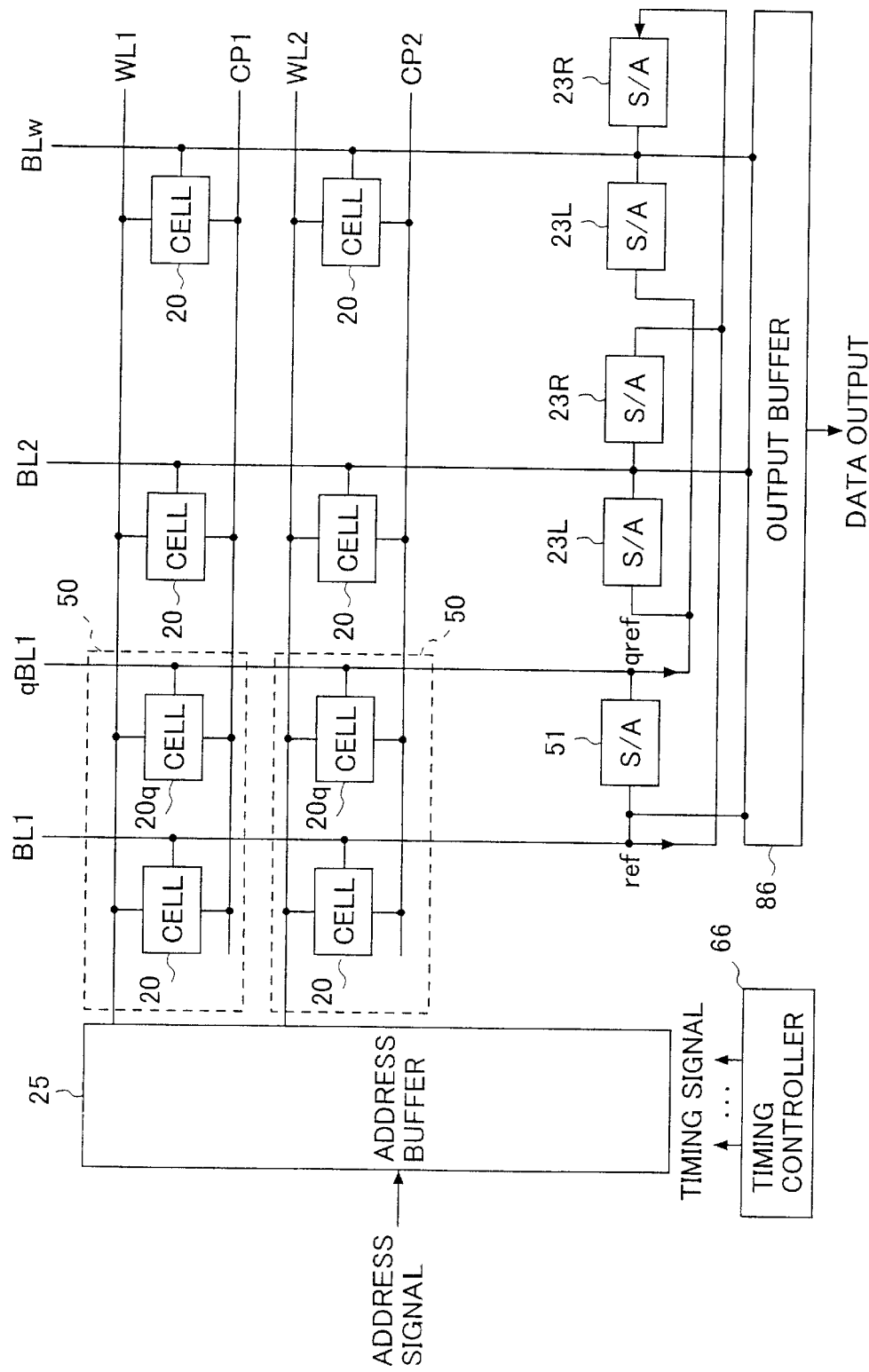
FIG. 11 is a circuit diagram of a semiconductor device according to a third embodiment of the present invention.
Figure 12:
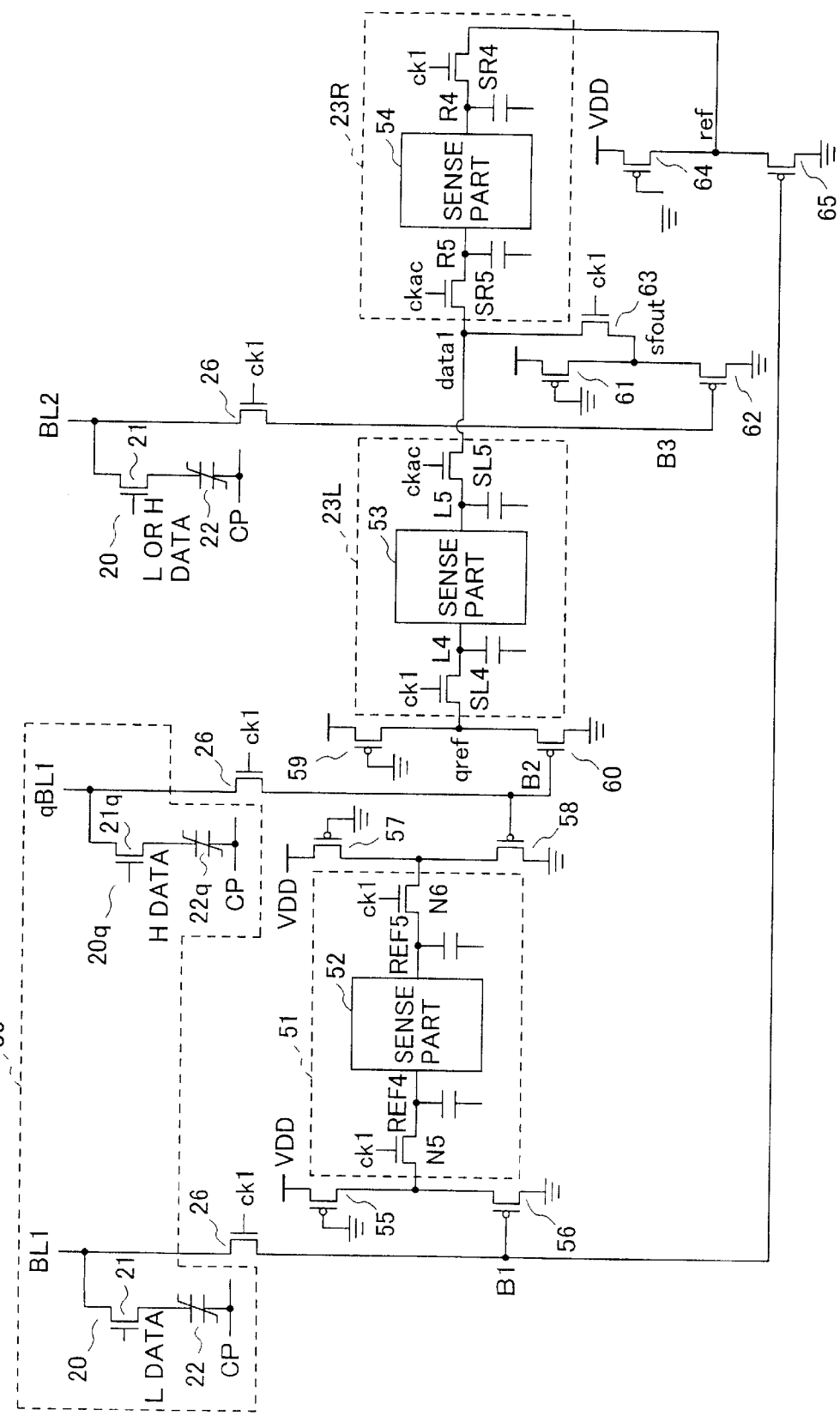
FIG. 12 is a circuit diagram of the semiconductor device shown in FIG. 11.

FIG. 11 is a block diagram of a semiconductor device according to a third embodiment of the present invention, and FIG. 12 is a circuit diagram thereof. The third embodiment of the present invention has a configuration in which the L-side reference voltage $Vref_L$ and the H-side reference voltage $Vref_H$ are generated by a 2T2C cell corresponding to one bit.

Referring to FIG. 11, there are newly provided a bit line $qBL_1$ that is to be paired with the bit lien $BL_1$ in addition to the n bit lines. A plurality of 2T2C cells 50 respectively connected to the corresponding word lines are connected to the pair of bit lines $BL_1$ and $qBL_1$. Each of the 2T2C cells 50 is made up of cells 20 and 20q. The memory cell 20 is made up of one cell transistor 21 and one cell capacitor 22. As shown in FIG. 12, the memory cell 20q is made up of a cell transistor 21q and the cell capacitor 22q. When the cell capacitor 22 of the memory cell 20 stores L data, the cell capacitor 22q of the complementary memory cell 20q stores H data. Hence, complementary items of data (consisting of L data and H data) are necessarily read to the bit lines $BL_1$ and $qBL_1$ in the read operation. In FIG. 12, the memory cell 20 stores L data, and the memory cell 20q stores H data.

The L data and H data thus read out serve as the L-side reference voltage $Vref_L$ and the H-side reference voltage $Vref_H$ of the sense amplifiers 23L and 23R of each sense amplifier, respectively. The items of read data on the bit lines $BL_1$ and $qBL_1$ have the complementary relationship, and do not depend on read data on the bit lines $BL_2$ through $BL_n$ at all. Hence, the third embodiment of the present invention does not need the bit line $BL_{n+1}$ and the logic combination circuit 37.

As shown in FIG. 12, the bit line $BL_1$ is connected to a sense amplifier 51 via a P-channel source follower circuit composed of PMOS transistors 55 and 56. The bit line $qBL_1$ is connected to the sense amplifier 51 via a P-channel source follower circuit composed of PMOS transistors 57 and 58. A sense part of the sense amplifier 51 is made up of PMOS transistors P1 through P4 and NMOS transistors N1 through N4 shown in FIG. 6. The P-channel source follower circuits serve as preamplifiers (buffer amplifiers).

The sense amplifier 23L is connected to the bit line $qBL_1$ via a P-channel source follower circuit composed of PMOS transistors 59 and 60, and is connected to the bit line $BL_2$ via a P-channel source follower circuit composed of PMOS transistors 61 and 62 and an NMOS transistor 63. The sense amplifier 23R is connected to the bit line $BL_1$ via a P-channel source follower circuit composed of PMOS transistors 64 and 65, and is connected to the bit line $BL_2$ via a P-channel source follower circuit composed of PMOS transistors 61 and 62 and an NMOS transistor 63. Each of the sense amplifiers 53 and 54 is made up of PMOS transistors P1 through P4 and NMOS transistors N1 through N4 as shown in FIG. 6.

In FIG. 12, the reference voltage depending on read data on the bit line $BL_1$ is denoted as ref, and the reference voltage depending on read data on the bit line $qBL_1$ is denoted as qref.

A description will be given of an operation of the circuit shown in FIG. 12 with reference to FIGS. 13A and 13B.

First, clocks ck1 and ckac for reading data from the memory cells 20 and 20q are turned ON. The clocks ck1 and ckac are generated by a timing controller 66 (FIG. 11) provided in the semiconductor device. Next, a capacitor plate line CP is raised to the power supply voltage VDD. Then, H and L data stored in the cell capacitors 22 and 22b charge sampling capacitors REF4, REF5, L4, L5, R4 and R5.

More particularly, the above charge operation is carried out as follows. It is assumed that L data (data "0") and H data (data "H") have been respectively written into the memory cells 20 and 20q of the 2T2C cell that generates the reference voltages. The clock ck1 turns ON the NMOS transistor 26, so that L data and H data are read to the bit lines $BL_1$ and $qBL_1$, respectively. The L data on the bit line $BL_1$ is applied to the gates of the PMOS transistors 56 and 65, so that level-shifted voltages lower than the L data by the threshold levels Vth thereof are applied to the sense amplifiers 51 and 23R as the L-side reference voltage $Vref_L$ that is the reference voltage ref. The H data on the bit line $qBL_1$ is applied to the gates of the PMOS transistors 58 and 60, so that the level-shifted voltages lower than the gate voltage by the threshold levels Vth of these transistors are applied to the sense amplifiers 51 and 23L as the H-side reference voltage $Vref_H$ that is the reference voltage qref.

Although not illustrated in FIG. 12, the above two reference voltages are applied to the sense amplifiers 23L and 23R connected to the bit lines $BL_3$ through $BL_n$.

The L-side reference voltage ref is held by the sampling capacitor R4 of the sense amplifier 23R via an NMOS transistor SR4. The H-side reference voltage qref is held by the sampling capacitor L4 of the sense amplifier 23L via an NMOS transistor SL4. The sampling capacitor REF4 of the sense amplifier 51 holds the L-side reference voltage ref via the NMOS transistor N5, and the sampling capacitor REF5 thereof holds the H-side reference voltage qref via the NMOS transistor N6. Further, the sampling capacitors R5 and L5 of the sense amplifiers 23R and 23L hold level-shifted voltages that are lower than the voltage read out to the bit line BL2 by the threshold voltage Vth of the PMOS transistor 62 when the clock ckac applied to the NMOS transistors SR5 and SL5 is turned ON.

FIG. 13A is a waveform diagram of an operation of the sense amplifiers 51, 23L and 23R performed when H data is read from the memory cell connected to the bit line $BL_2$.

The clocks ck1 and ckac are turned ON from OFF, so that the potential of the capacitor plate CP rises. The H data is read to the bit line $BL_2$ from the memory cell 20, so that the potentials of the sampling capacitors L5 and R5 rise. The potential of the sampling capacitor R4, which is lower than the voltage on the bit line $BL_1$ to which L data is read by raising the potential of the capacitor plate CP, rises relatively slowly. On the other hand, the potential of the sampling capacitor L4, which is lower than the voltage on the bit line $qBL_1$ to which H data is read, rises relatively quickly.

Next, the clock ck1 is turned OFF and the power supply to the sense amplifier (P1 and P3 and N3 and N4 shown in FIG. 6) is turned ON while the clock ckac is kept ON. The sense amplifier 23R senses the potential difference between the sampling capacitors R4 and R5, and the sense amplifier 23L senses the potential difference between the sampling capacitors L4 and L5. As shown in FIG. 13A, the potential difference between the sampling capacitors R4 and R5 is greater than the potential difference between the sampling capacitors L4 and L5. Thus, the sense amplifier 23R performs the amplifying operation more quickly and strongly than the sense amplifier 23L. As a result, the comparatively high read level of the sampling capacitor R5 of the sense amplifier 23R is amplified to the H level (VDD), and the comparatively low read level of the sampling capacitor R4 is amplified to the L (ground) level (VSS). The read level of the sampling capacitor L5 of the sense amplifier 23L is amplified to the H level (VDD), while the read level of the sampling capacitor L4 is amplified to the VSS level.

As described above, the difference between the sense operations based on the input potential difference between the sense amplifiers 23R and 23L defines the cell read logic. When the clock ckac is turned OFF, the potentials of the nodes are defined.

Figure 13B:
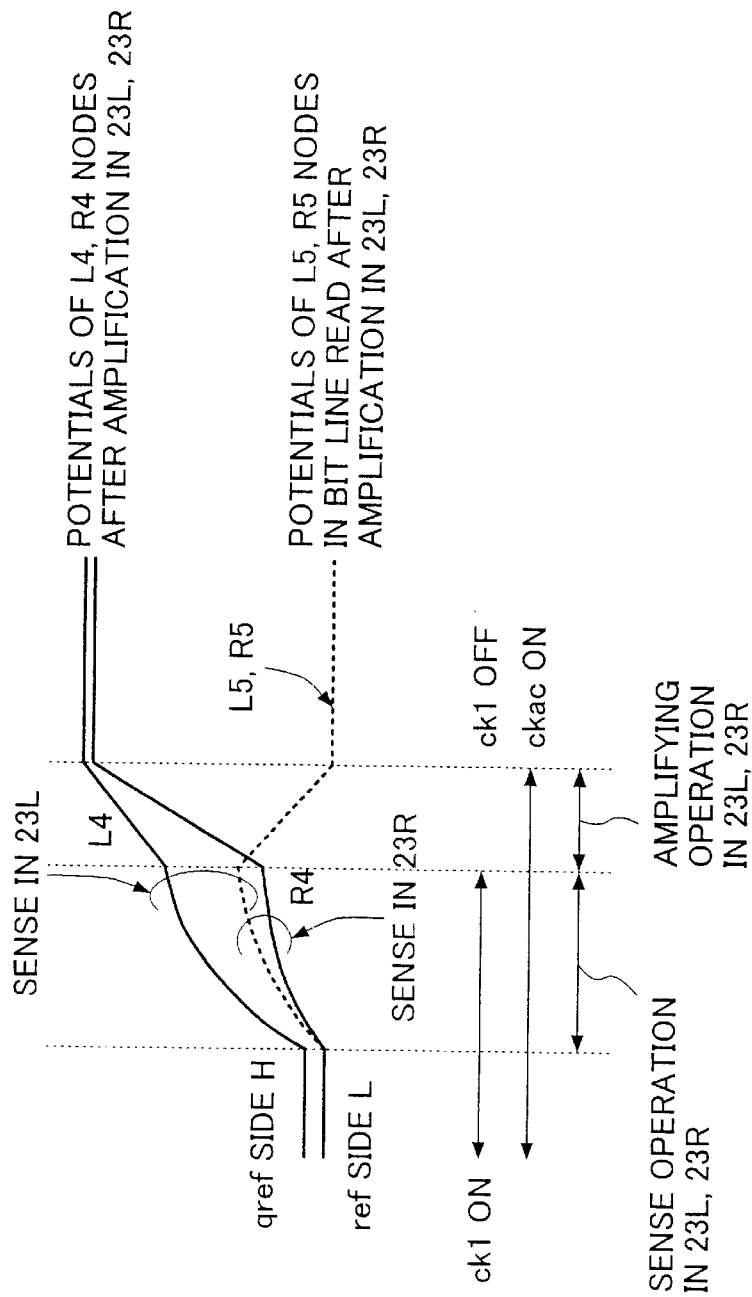

FIG. 13B is a waveform diagram of an operation of the sense amplifiers 51, 23L and 23R performed when L data is read from the memory cell 20 connected to the bit line $BL_2$. When the potential of the capacitor plate CP is raised, the potentials of the sampling capacitors L5 and R5 raise slowly due to the L data read out to the bit line $BL_2$.

The sense amplifier 23R senses the potential difference between the sampling capacitors R4 and R5, and the sense amplifier 23L senses the potential difference between the sampling capacitors L4 and L5. The latter potential difference is greater than the former potential difference, so that the sense amplifier 23L performs the amplifying operation more quickly and strongly than the sense amplifier 23R. Thus, the potential of the sampling capacitor R4 of the sense amplifier 23R shifts to VDD.

As described above, the semiconductor device according to the third embodiment of the present invention comprises memory cells 20 of one-transistor one-capacitor type connected to n−1 bit lines among n+1 bit lines $BL_1$, $qBL_1$, $BL_2$ through $BL_n$ that are driven simultaneously, memory cells 50 of two-transistor two-capacitor type connected to two remaining bit lines $BL_1$ and $qBL_1$, pairs of sense amplifiers 23L and 23R connected to the n−1 bit lines, and single sense amplifiers 51 respectively connected to the two remaining bit lines, each of the pairs of sense amplifiers receiving reference voltages that are voltages ref, qref of the two remaining bit lines or voltages corresponding thereto (voltages obtained after the voltages ref, qref pass through the PMOS source follower circuits).

Figure 14:
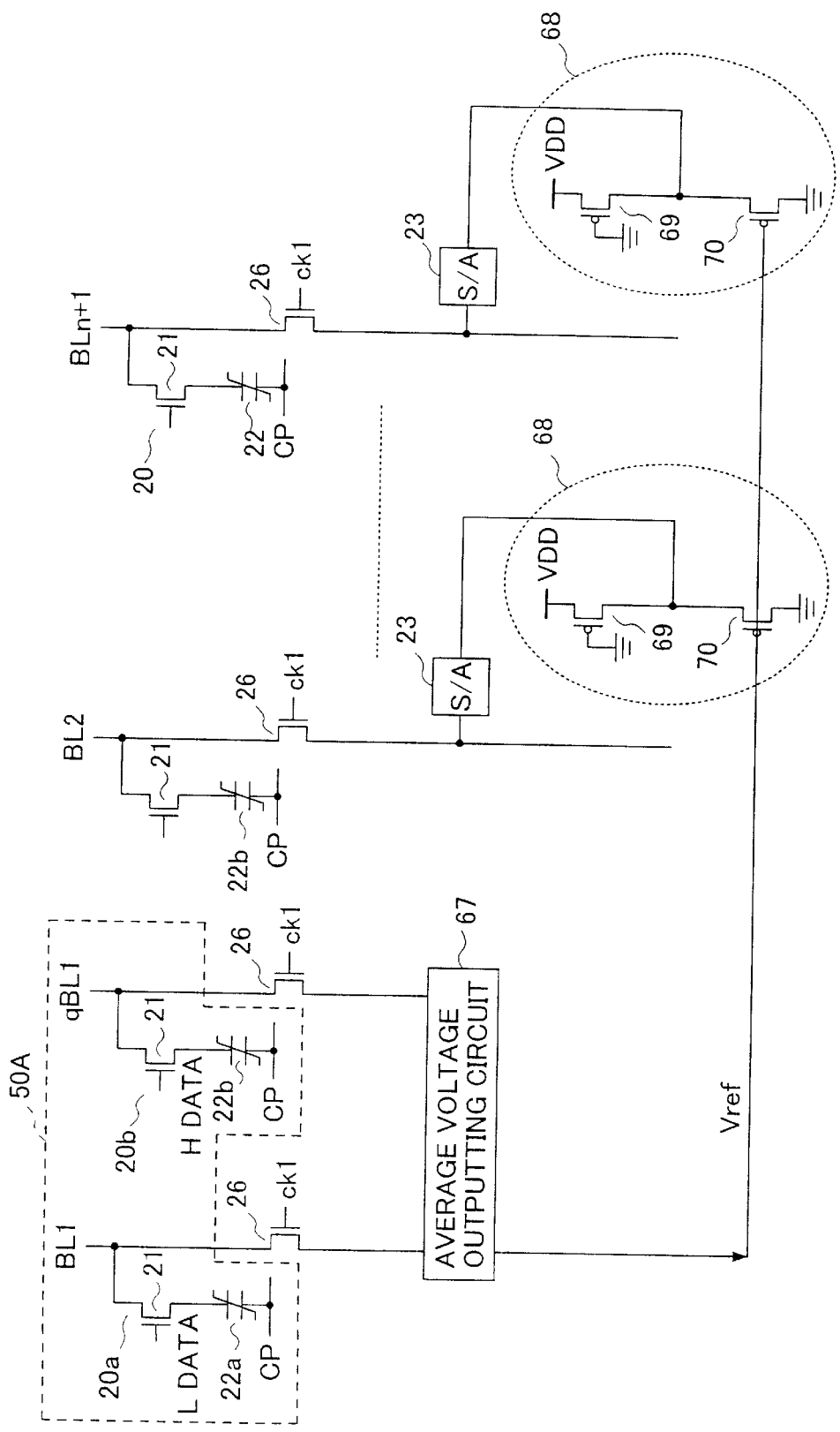
FIG. 14 is a circuit diagram of a semiconductor device according to a fourth embodiment of the present invention.

FIG. 14 is a circuit diagram of a semiconductor device according to a fourth embodiment of the present invention. This semiconductor device is directed to a single sense amplifier configuration in which the aforementioned reference voltage generating circuit 24 is replaced by a 2T2C cell 50A and an average voltage output circuit 67.

The 2T2C cell 50A is composed of two cells 20a and 20b. A capacitor 22a of the cell 20a connected to the bit line $BL_1$ constantly holds L data, and a capacitor 22b of the cell 20b connected to the bit line $qBL_1$ constantly holds H data. The average voltage output circuit 67 has the circuit configuration shown in FIG. 5C. The bit line $BL_1$ is connected to the gate of the NMOS transistor 34, and the bit line $qBL_1$ is connected to the gate of the NMOS transistor 33. The average voltage output circuit 67 outputs the average voltage of the L data and the H data as the reference voltage Vref. This reference voltage Vref is supplied to the sense amplifiers associated with the bit lines $BL_2$ through $BL_{n+1}$ via P-channel source follower circuits 68 each composed of PMOS transistors 69 and 70.

The source follower circuits 68, which function as preamplifiers, may be omitted. That is, the reference voltage Vref output by the average voltage generating circuit 67 may directly be applied to the sense amplifiers 23.

The configuration shown in FIG. 14 is simple and occupies a small chip area, as compared with the configurations shown in FIGS. 3 and 4.

As described above, the semiconductor device according to the fourth embodiment of the present invention comprises first memory cells 20 of one-transistor one-capacitor type connected to n bit lines $BL_2$ through $BL_{n+1}$, second memory cells 20a, 20b of one-transistor one-capacitor type connected to two bit lines $BL_1$ and $qBL_1$ and driven at the same time as the n bit lines, sense amplifiers connected to the n bit lines, and the reference voltage outputting circuit which generates the average voltage of complementary data read to the two bit lines $BL_1$ and $qBL_1$ and outputs the average voltage to the sense amplifiers as the reference voltage Vref.

The first through fourth embodiments of the present invention have been described. The present invention is not limited to the semiconductor memory device or memory chip but includes various semiconductor devices having semiconductor memories. Also, though the first through fourth embodiments of the present invention employ ferroelectric memories, the present invention includes other types of memories.

According to the present invention, it is possible to provide a semiconductor device in which a larger number of rewrite times can be ensured by the 1T1C type cells without increasing the chip area.

The present invention is not limited to the specifically disclosed embodiments, and variations and modifications may be made without departing from the scope of the present invention.

The present application is based on Japanese priority application no. 2000-3544897 filed on Nov. 21, 2000, the entire contents of which are hereby incorporated by reference.

What is claimed is:

1. A semiconductor device comprising:
    memory cells of one-transistor one-capacitor connected to n+1 bit lines that are simultaneously driven;
    sense amplifiers connected to the n+1 bit lines; and
    a reference voltage generating circuit generates an average voltage of a highest voltage and a lowest voltage among bit line voltages that are obtained by accessing the n+1 bit lines in parallel, and supplying the average voltage to the sense amplifiers as a reference voltage.

2. A semiconductor device comprising:
    memory cells of one-transistor one-capacitor type connected to n+1 bit lines that are simultaneously driven;
    pairs of sense amplifiers respectively connected to the n+1 bit lines; and
    a reference voltage generating circuit supplying, as first and second reference voltages, the sense amplifiers with a highest voltage and a lowest voltage among bit line voltages obtained when the n+1 bit lines are accessed in parallel, or voltage corresponding to the highest and lowest voltages.

3. The semiconductor device as claimed in claim 2, wherein one of each of the pairs of sense amplifiers compares the first reference voltage with a voltage of a corresponding one of the n+1 bit lines, and the other sense amplifier compares the second reference voltage with a voltage of said corresponding one of the n+1 bit lines, so that a level of said corresponding one of the n+1 bit lines is determined.

4. The sense amplifier as claimed in claim 2, further comprising a logic combination circuit which writes data into one of the memory cells connected to an (n+1)th bit line so that data "1" and data "0" coexist in n+1 bits of data.

5. The sense amplifier as claimed in claim 3, further comprising a logic combination circuit which writes data into one of the memory cells connected to an (n+1)th bit line so that data "1" and data "0" coexist in n+1 bits of data.

6. The sense amplifier as claimed in claim 4, wherein said logic combination circuit determines a value of the data to be written into said one of the memory cells connected to the (n+1)th bit line on the basis of data of n bits on the n bit lines.

7. The sense amplifier as claimed in claim 5, wherein said logic combination circuit determines a value of the data to be written into said one of the memory cells connected to the (n+1)th bit line on the basis of data of n bits on the n bit lines.

* * * * *